United States Patent [19]

Suto

[11] Patent Number: 4,517,511
[45] Date of Patent: May 14, 1985

[54] CURRENT PROBE SIGNAL PROCESSING CIRCUIT EMPLOYING SAMPLE AND HOLD TECHNIQUE TO LOCATE CIRCUIT FAULTS

[75] Inventor: Anthony J. Suto, Clifton Park, N.Y.

[73] Assignee: Fairchild Camera And Instrument Corporation, Clifton Park, N.Y.

[21] Appl. No.: 610,347

[22] Filed: Jul. 13, 1984

Related U.S. Application Data

[63] Continuation of Ser. No. 312,158, Oct. 16, 1981, abandoned.

[51] Int. Cl.³ .................. G01R 31/08; G01R 31/28
[52] U.S. Cl. .................. 324/52; 324/73 PC
[58] Field of Search .............. 324/52, 73 R, 73 PC, 324/133, 329

[56] References Cited

U.S. PATENT DOCUMENTS

| | | | |
|---|---|---|---|
| 3,617,879 | 11/1971 | Mugnier | 324/133 X |
| 4,074,188 | 2/1978 | Boatman et al. | 324/52 |
| 4,115,731 | 9/1978 | Axtell | 324/73 PC X |
| 4,186,338 | 1/1980 | Fichtenbaum | 324/73 PC X |
| 4,345,201 | 8/1982 | Thompson et al. | 324/73 PC X |
| 4,370,610 | 1/1983 | Allen et al. | 324/52 |

FOREIGN PATENT DOCUMENTS

| | | | |
|---|---|---|---|
| 1315684 | 5/1973 | United Kingdom | 324/329 |
| 2041532 | 9/1980 | United Kingdom | 324/329 |

*Primary Examiner*—Gerard R. Strecker
*Attorney, Agent, or Firm*—Randall J. Gort

[57] ABSTRACT

During the in-circuit testing of electronic components, stimulus pulses are applied to a circuit bus producing an improper output signal, and the response of the circuit at various nodes connected to the bus is sensed with a current probe. An output signal from the current probe that is indicative of the magnitude and relative direction of the sensed current is sampled during each of the stimulus pulses to thereby isolate the portion of the output signal relating to the pulses from any noise in the circuit being tested. The sampled signal is further integrated to provide an additional measure of isolation, so that the probe signal processing circuit is relatively insensitive to both constant, high frequency noise and random, irregular or low frequency noise components.

18 Claims, 5 Drawing Figures

CURRENT PROBE SIGNAL PROCESSING CIRCUIT EMPLOYING SAMPLE AND HOLD TECHNIQUE TO LOCATE CIRCUIT FAULTS

This is a continuation of application Ser. No. 312,158 filed Oct. 16, 1981, now abandoned.

BACKGROUND OF THE INVENTION

The present invention relates to an apparatus and method for locating a fault within an electric circuit, and more particularly to a fault locating method and apparatus in which a device for sensing current is synchronized with a signal generating source for producing a current to be detected, which current provides an indication of the location of the fault.

In the field of automatic in-circuit electrical component testing, it is sometimes necessary to utilize a manually positioned current probe to identify a faulty component, such as a gate, with particularity. Typically, in the operation of an automatic in-circuit electronic component tester, such as those illustrated, for example, in U.S. Pat. Nos. 3,870,953 and 4,216,539, the tester is connected to various nodes or busses on a printed circuit board containing the component to be tested. Stimulus signals are injected at some of these nodes and the response of the component to these signals are detected at other nodes and processed to determine whether the component is functioning properly. Since a number of different components can be connected to a single node, the tester is not always capable of identifying the particular component that causes a faulty signal to be produced on such a node. In this case, it becomes necessary for the operator of the tester to utilize a hand-held current probe to detect the value of the current flowing into or from each of the various components connected to the node at which the improper response signal appears.

Use of the current probe typically involves injecting a signal onto the node, or common bus, producing the improper response signal. For example, in the testing of digital equipment, if the signal at a faulty bus improperly remains in one binary state because a gate connected to the bus is faulty, pulses of an opposite polarity from that binary state are applied to the bus, to thereby produce a current flow. The operator of the test equipment places a current probe on the lead connecting each of the possibly faulty gates to the bus. The lead connecting the faulty gate to the bus will carry the greatest current, to thereby indicate the particular faulty component. A similar approach using a complementary signal can be used during the testing of analog equipment.

One prior art method for processing the output signal produced by a current probe has been to square the output signal so that all pulses in it are of the same polarity and then determine a DC value for the signal based upon the amplitudes of the squared pulses. The component producing the highest DC value is identified as the faulty component.

One problem associated with this type of signal processing is the fact that it is dependent upon the duty cycle of the pulses applied to the bus. More specifically, the DC value is determined by integrating the value of each pulse over time. Therefore, in order to obtain the highest possible DC value for each output signal, and thereby obtain the greatest resolution, the duty cycle of the applied pulses should be high to reduce the time between pulses during which the DC signal decays. However, the pulses that are applied to the bus operate to back drive each component connected to the bus, thereby causing the temperature of the components to rise. If the duty cycle of the applied pulses is too high, the temperature threshold of the components will be exceeded, causing them to break down. Thus, it is necessary to compromise the resolution that can be obtained from the current probe output signal in view of the thermal capabilities of the electrical components.

Another problem associated with prior art current probes used for in-circuit electronic component testing is the fact that the probes are responsive to stray currents, electromagnetic noise and the like, as well as the applied stimulus pulses. For example, a circuit board might contain a number of conductors running parallel to one another. Since most known current probes operate on either inductive priciples or the Hall effect, a current probe used to detect the current flowing in one of the conductors will be affected by the electromagnetic fields generated by currents flowing in any of the other nearby conductors.

Accordingly, it is a general object of the present invention to provide a novel current sensing device that is capable of providing high signal resolution and indicating relative current direction in the presence of noise.

It is another object of the present invention to provide a novel current sensing apparatus that is not dependent upon the duty cycle of an injected stimulus signal to obtain good resolution in an output signal.

It is a further object of the present invention to provide a novel current sensor that is synchronized with an applied stimulus signal to thereby reduce the response of the sensor to undesirable noise in the system being tested.

It is yet another object of the present invention to provide a novel method for processing the output signal of a current probe to reduce the effects of noise on the signal that is desired to be measured.

It is yet an additional object of the present invention to provide a novel current probe signal processing circuit in which the signal is sampled and integrated to further eliminate the effects of unwanted noise on the current measurement process.

It is a particular object of the present invention to provide a novel current probe circuit for use with an automatic in-circuit component tester.

One system for synchronizing a current sensor output signal to an applied stimulus signal is disclosed in U.S. Pat. No. 4,074,188. In that system, a synchronizing signal is applied as an enabling signal to a comparator that compares the sensor output signal to one or more threshold values. The present invention offers a different approach, utilizing a sample and hold technique, for synchronizing the applied and measured signals. The particular manner in which the present invention synchronizes the signals, and thereby achieves the foregoing objects and advantages, will become apparent to a person of ordinary skill in the art upon a persual of the following detailed description of a preferred embodiment thereof, when taken in conjunction with the accompanying drawings.

DETAILED DESCRIPTION

In the following description of the preferred embodiment of the invention, reference is made to use of the invention in the context of in-circuit testing of electric components, where such an illustration facilitates an understanding and appreciation of the invention. However, it will be appreciated by those of ordinary skill in the art that the invention is not limited to such an environment, but rather is applicable to a variety of situations in which the detection of a current in a conductor is desirable.

Figure 1:
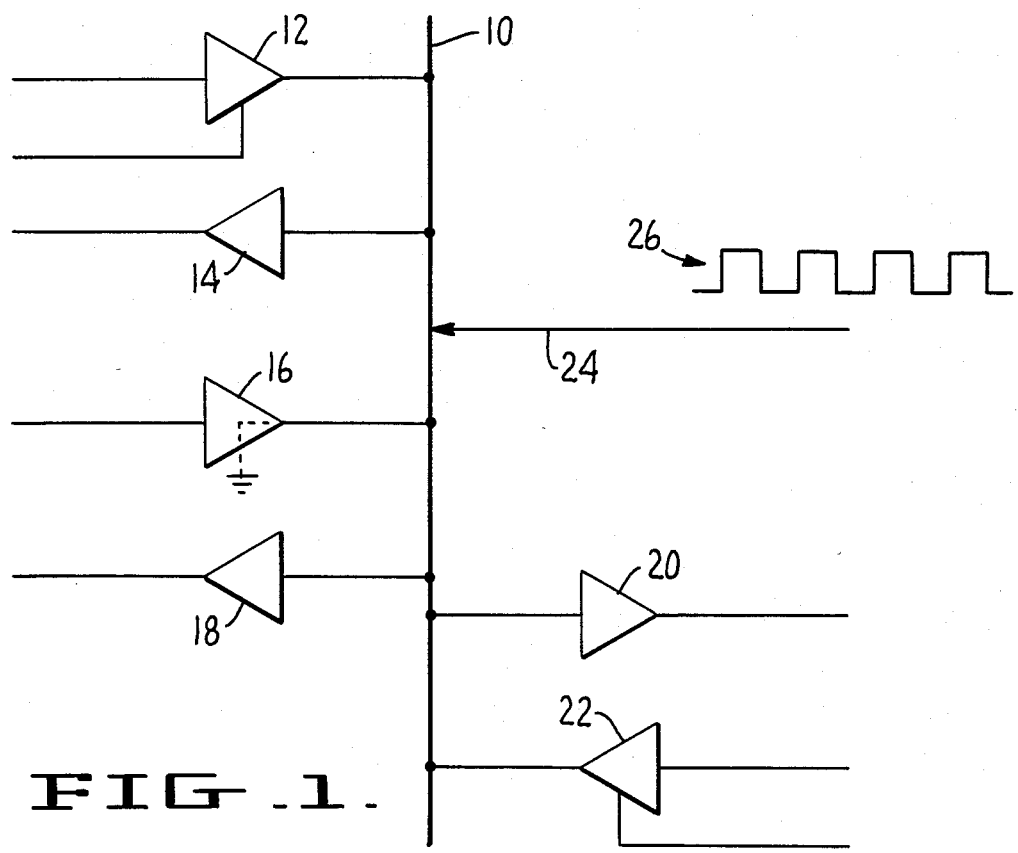
FIG. 1 is a schematic circuit diagram illustrating a typical test situation involving the use of a current probe.

An example of a typical situation in which a current probe might be used during the in-circuit testing of electronic components is illustrated in FIG. 1. The circuit under test includes a common bus 10 having a plurality of logic gates 12–22 connected thereto. The bus 10 forms a node to which a connector pin 24 of an automatic in-circuit test fixture is connected. As illustrated by the dotted lines, one of the logic gates 16 is faulty possibly due to an improper ground connection at its output terminal, causing it to act as a current sink. Other types of faults, such as those which cause the bus to function as a current source, can also be detected with a current probe.

During the testing of the circuit, the signal that appears on the test pin 24 will always be in a binary low state regardless of the input or output signals to or from the logic gates 12, 14, 18, 20 and 22, due to the connection of the bus 10 to ground through the gate 16. Therefore, during the testing of the circuit, the automatic tester will provide an indication that there is a faulty component connected to the bus 10.

To identify the particular component or components that are not functioning properly, a series of pulses 26 having the opposite polarity from the polarity at which the faulty note is maintained, in the present case a series of binary high signals, are applied to the bus to cause a current to flow along the bus to the current sink, i.e., the ground connection. These pulses can be applied through the test fixture pin 24, or alternatively can be injected into the bus through a separate hand-held pulse generating probe. The operator of the test circuit successively places the tip of a current sensing probe on each of the leads connecting the logic gates 12–22 to the common bus 10, and the current flowing in each of these leads is detected. In the example illustrated in FIG. 1, the greatest current flow should be detected in the lead connecting the logic gate 16 to the bus 10, due to the improper ground connection. Thus, when the results of the current detection for each of the logic gates are compared with one another, an indication will be provided that the gate 16 is faulty and should be replaced, resoldered or otherwise appropriately attended to.

Figure 2:
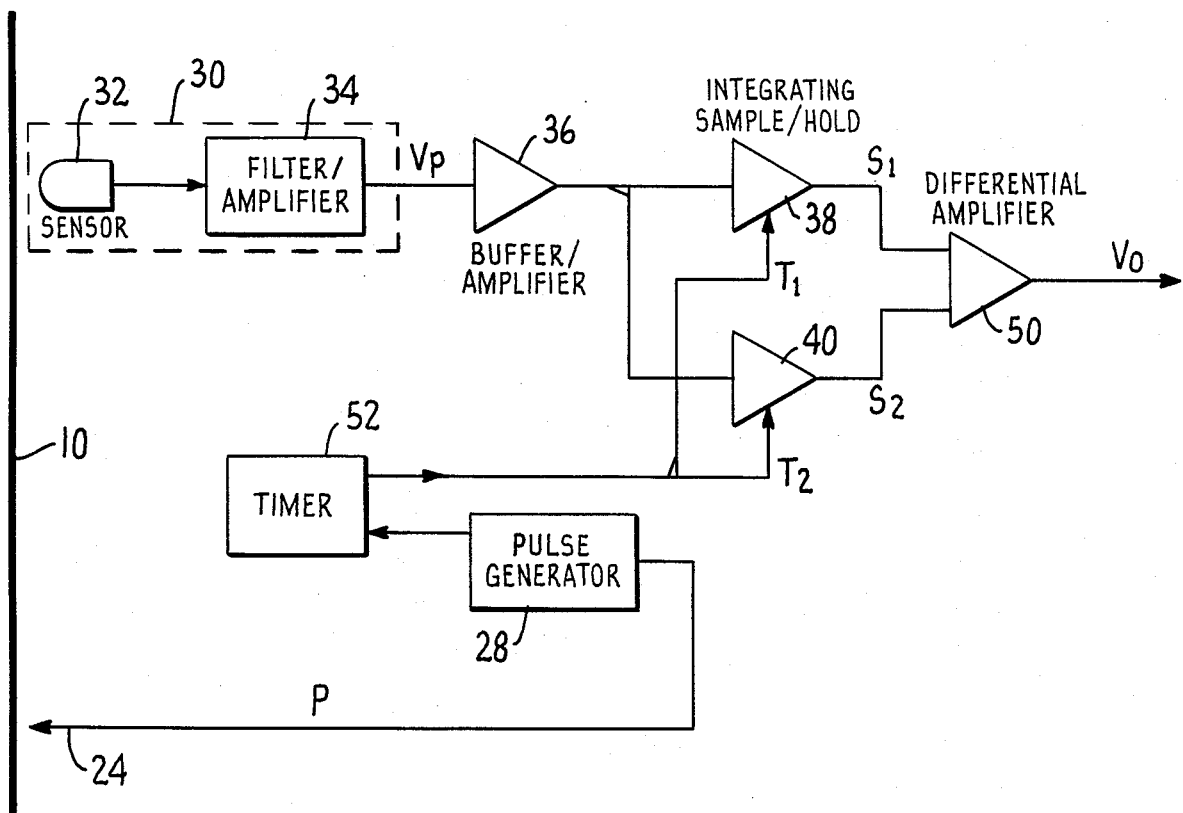
FIG. 2 is a block circuit diagram of a current processing circuit implementing the concepts of the present invention.

Referring now to FIG. 2, a circuit for detecting the current flowing in the various leads of the logic gates is illustrated in block diagram form. A more detailed schematic diagram of the signal processing portion of the circuit appears in FIG. 3. The stimulus pulses P to be applied to the bus 10 through the test pin fixture 24, or a separate handheld pulser, are supplied by a pulse generator 28 that can comprise any suitable type of oscillator and associated pulse shaping circuitry for generating current pulses of a desired magnitude and frequency. The current flowing in the bus 10 is detected by a current probe 30. The probe 30 can be any suitable conventional device that provides an output voltage proportional to the current flowing in the bus 10, including any of the presently available current probes that operate on either inductive principles or in accordance with the Hall effect to detect the magnitude of the current flow. The probe can include a sensor 32, for example an inductive tip, and an internal filtering and amplification stage 34 which, for example, performs a band-limiting function on the signal that is produced by the probe.

The output signal $V_p$ from the probe 30 can be applied to a suitable buffer or amplifier 36, and is fed to two integrating sample and hold circuits 38 and 40. Each of the integrating sample and hold circuits includes an analog switch 42 that is periodically closed to sample a portion of the probe output signal $V_p$. The portion of the output signal passed by the switch is presented to a storage circuit comprising a resistor 44, a storage capacitor 46 and a buffer 48. In addition to storing the sampled portion of the signal, the storage circuit also functions to integrate the signal in accordance with the RC time constant determined by the values of the resistor 44 and the capacitor 46. The integrated sample signal of each of the sample and hold circuits 38 and 40 is fed to a respective input terminal of a differential amplifier 50, which produces an output signal $V_o$ related to the difference between the two samples of the signal.

The operation of the sample and hold circuits 38 and 40, specifically the actuation of the switch 42 in each circuit, is synchronized with the stimulus pulses P by means of a timer circuit 52. The illustrated embodiment of the timer circuit includes two one-shot multivibrators 54 and 56 that are triggered by the stimulus pulses to produce timing pulses which actuate the switches 42 to sample the probe output signal at predetermined times related to the stimulus pulses.

Figure 3:
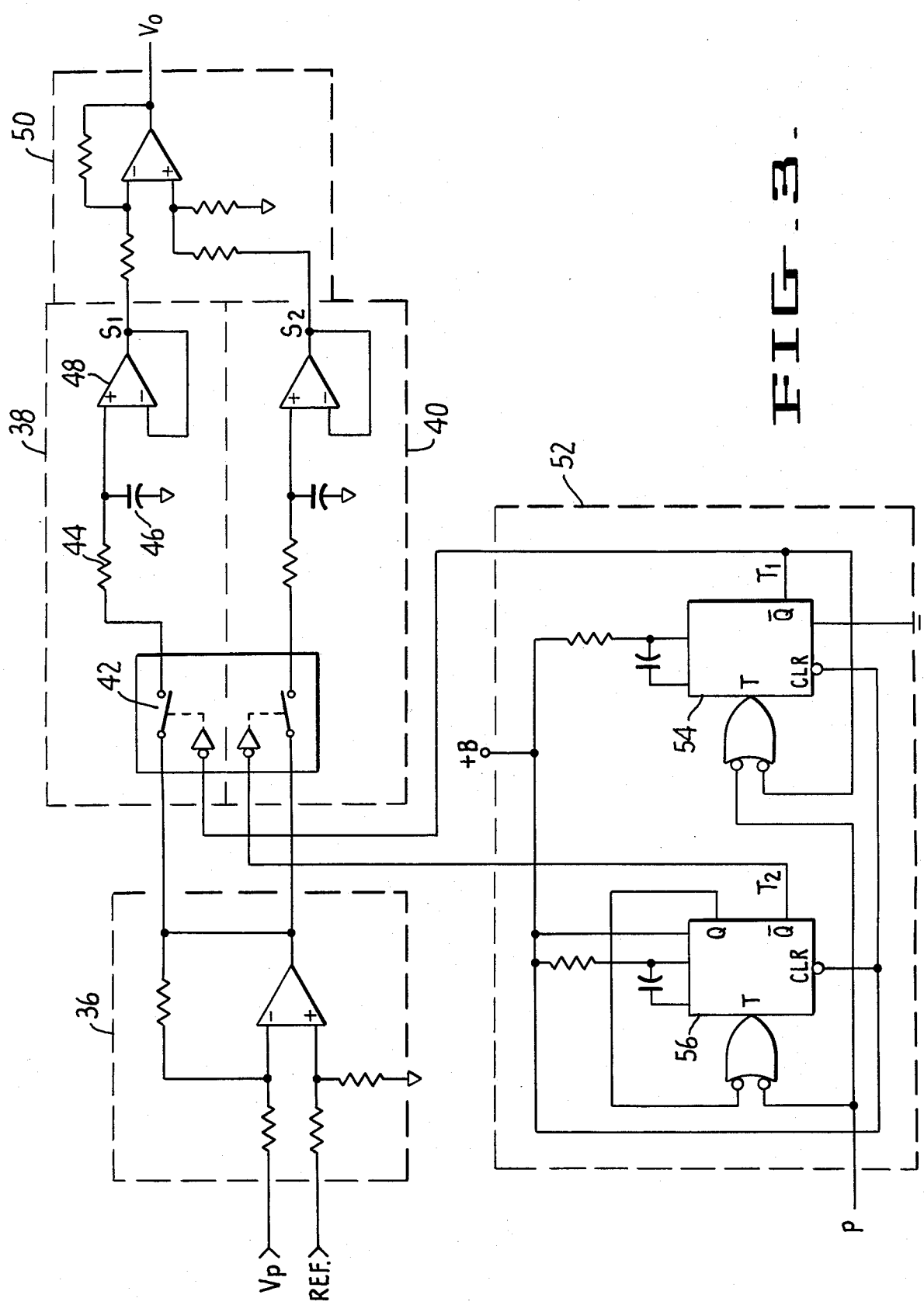
FIG. 3 is a detailed schematic circuit diagram of a portion of the current processing circuit illustrated in FIG. 2.
Figure 4:
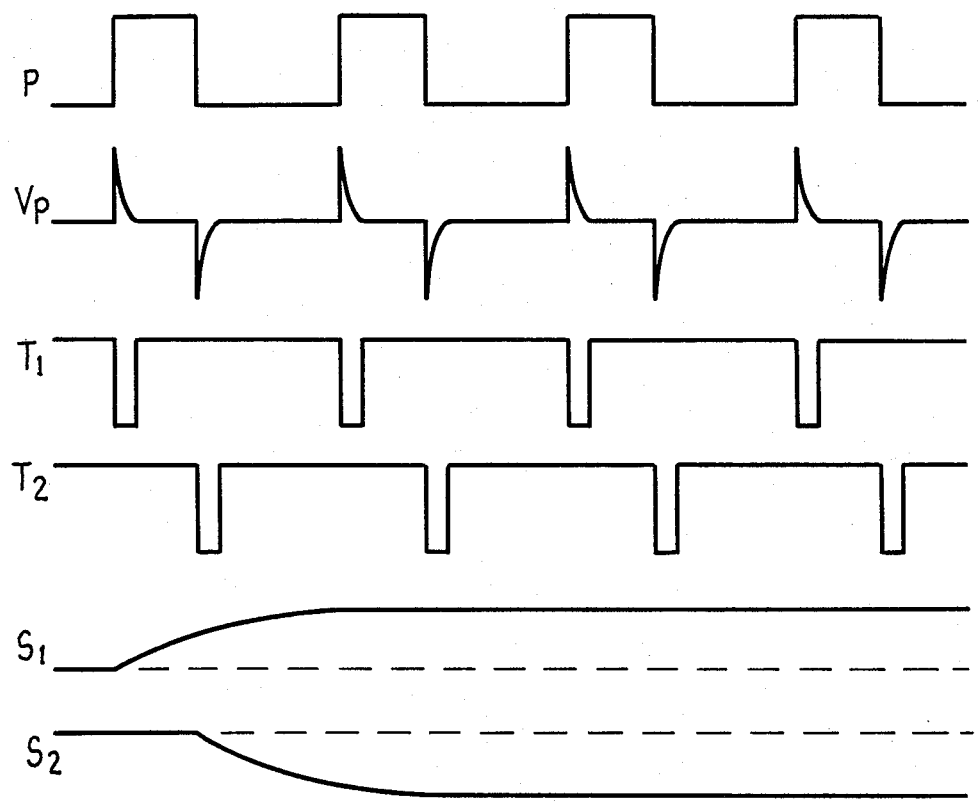
FIG. 4 is a timing diagram for the operation of the current processing circuit of FIGS. 2 and 3 with an inductive type of current probe.

The operation of the current sensor illustrated in FIGS. 2 and 3 is best understood with reference to the timing diagram of FIG. 4. The diagram of FIG. 4 specifically relates to the embodiment of the invention wherein an inductive type of current probe is used. The output signal from such a probe is the derivative of the current being sensed. Thus, the stimulus pulses P that are applied to the common bus 10 result in an output signal $V_p$ from the probe consisting of a series of alternating positive and negative impulses. The integrating sample and hold circuits 38 and 40 are actuated to sample the probe output signal $V_p$ at the occurrence of the leading and trailing edges of the pulses P, respectively. For example, referring to FIG. 3, one of the one-shot multivibrators 54 in the timing circuit 52 can be triggered with the leading edge of each pulse, and the other multivibrator 56 can be triggered with the trailing edge of each pulse.

The width of each of the timing pulses in the output signals from the timing circuit 52 are preferably established so that only that portion of the probe output signal $V_p$ that is related to the stimulus pulses will be sampled. For example, the width of each of the sample pulses in the timing signals can be in the neighborhood of 2.5 microseconds to sample the impulses in the probe output signal $V_p$. Thus, in this manner, the probe signal processing circuit is synchronized with the stimulus pulses applied to the circuit under test so that the effect of extraneous signals in the circuit will be largely ignored during processing. Specifically, any noise components appearing in the probe output signal $V_p$ outside of the sample periods will have no effect upon the probe circuit output signal $V_o$. Furthermore, any constant noise appearing during both samples will be cancelled in the differential amplifier 50.

The samples of the probe output signal are integrated over time in the integrating sample and hold circuits 38 and 40, and the resulting output signals $S_1$ and $S_2$ from these circuits exponentially approach constant values equal to the amplitudes of the impulses in the probe output signal $V_p$. The integration of the sampled signals provides an additional measure of isolation from noise components. Specifically, the integration of the signals causes the resulting output signals to be related to constant values in the sampled signals and largely ignores any extraneous peaks, spikes, or the like that may be caused, for example, by slight movement of the probe as it is being held by the operator.

In the timing diagram of FIG. 4, the sampled output signals $S_1$ and $S_2$ are illustrated as approaching the constant value after approximately only two sample periods, for the sake of illustration. It will be appreciated by those of ordinary skill, however, that it may take several sample periods before the integrated signals reach a constant value. However, this fact is of little consequence in a practical embodiment of the invention. For example, the stimulus pulses might have a width of 20 microseconds and a "dead time" of 300 microseconds between each pulse. If the RC constant of the integrating sample and hold circuits 38 and 40 is set at approximately 1125 microseconds and it is assumed that it takes 5 sample periods for the integrated signal to reach a constant value, the total settling time of the circuit, i.e., time to reach the constant value, will be only 360 milliseconds. Such a short period of time is of little consequence in light of the fact that the probe is being manually applied to each point to be tested in the circuit, and an operator could be expected to hold the probe on each point for a minimum period of at least one second.

The two output signals $S_1$ and $S_2$ from the sample and hold circuits 38 and 40 are applied as input signals to the differential amplifier 50, which prodcues an output signal $V_o$ related to their difference. This output signal is indicative of the magnitude and relative direction of the current being sensed by the current probe 30 at the node being tested. The signal can be fed to the automatic in-circuit tester where it is stored, after possibly being mathematically weighted and averaged with a number of other tests of the same node. Once all nodes common to the faulty bus have been tested, the tester will select the node producing the largest absolute output signal $V_o$ as corresponding to the pin that is either sinking or sourcing the largest current in the bus, and hence is the pin of the defective component connected to the bus.

Figure 5:
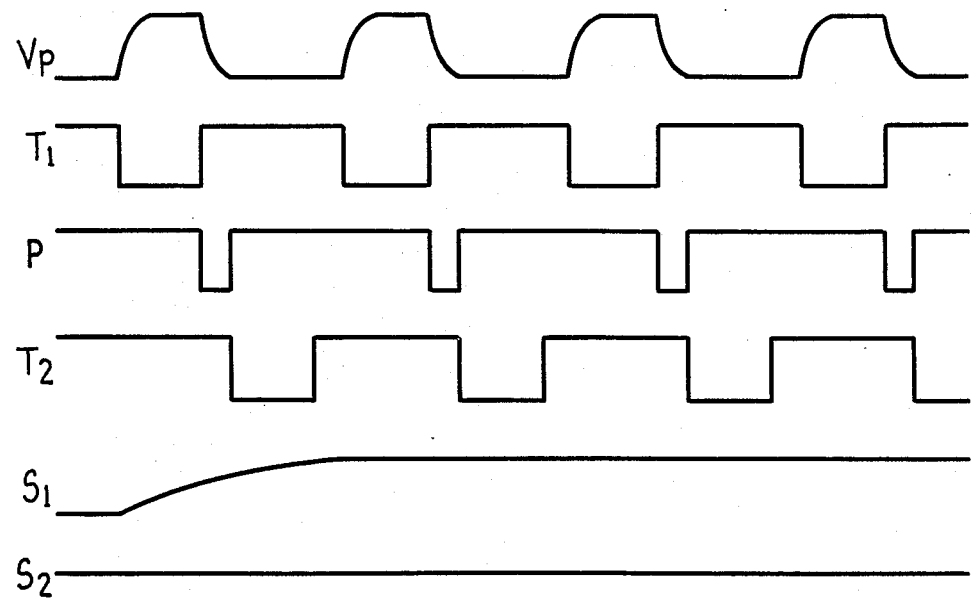
FIG. 5 is a timing diagram for the operation of the current processing circuit with a Hall effect type probe.

The operation of the signal processing circuit can be slightly different from the preceding example when a Hall effect type current probe is used. This operation is illustrated in the timing diagram of FIG. 5. The output signal $V_p$ of a Hall effect type probe has a shape that is substantially the same as the shape of the current being sensed, rather than consisting of a series of impulses resulting from the derivative of the sensed signal as in an inductive device. In such a case, it may be useful to take one sample of the probe output signal during each stimulus pulse and another sample after the termination of each pulse. Thus, one of the sample signals $T_1$ can apply a sample pulse to one of the sample and hold circuits 38 or 40 during each of the pulses in the stimulus signal. The length of each sample pulse can be the same as the width of each stimulus pulse P, or it can be smaller so that only the central portion of each pulse in the probe signal $V_p$ is sampled. After the termination of each of these sample pulses, a delay time D, for example 10 microseconds, will be established within the timing circuit 52, for example by another multivibrator (not shown in FIG. 3). At the termination of this delay time, the second sample pulse $T_2$ can be produced to cause the other sample and hold circuit to sample the probe output signal $V_p$ during the "dead time" between pulses.

The output signal $S_1$ relating to the samples that are taken during each stimulus pulse will approach a constant value related to the magnitude and relative direction of each sensed pulse. However, the other output signal $S_2$ will remain substantially at its initial level. With this arrangement, any low frequency noise components that are present in the probe output signal $V_p$ will be sampled during each sample period, and thereby cancelled out in the differential amplifier 50, so that the resulting output signal $V_o$ relates only to the sensing of the stimulus pulses. On the other hand, any high frequency noise components present in the probe output signal will not remain constant for each sample, and thus will be factored out of the output signals $S_1$ and $S_2$ through the integration thereof.

From the foregoing, it will be appreciated that the present invention provides a novel system for applying stimulus pulses to a circuit and measuring the response of the circuit to these pulses while substantially ignoring any extraneous noise components. The synchronization of the current sensor to the stimulus pulses isolates the signal processing system from relatively constant noise present in the system. The further integration of the synchronized response signals enables any random, non-constant noise to be likewise ignored. Preferably, both of these functions are carried out with relatively simple integrating sample and hold circuits that are triggered in response to the applied stimulus pulses.

The present invention may be embodied in other specific forms without departing from the spirit or essential characteristics thereof. For example, although the invention has been described with particular reference to its use in the in-circuit testing of electronic components, other applications thereof will be readily apparent to those of skill in the art. The presently disclosed embodiments are therefore considered in all respects as illustrative and not restrictive. The scope of the invention is indicated by the appended claims rather than the foregoing description, and all changes which come within the meaning and range of equivalency of the claims are therefore intended to be embraced therein.

What is claimed is:

1. Apparatus for locating a fault within an electrical circuit comprising:
   a pulse generator for applying electrical stimulus pulses to a current carrying conductor;

means for electrically connecting said pulse generator to the conductor;

a current responsive detector for producing an output signal related to the current flowing in said conductor;

means including a first and a second sample and hold circuit for processing said output signal to determine at least one parameter of the current flowing in said conductor; and synchronizing means for actuating said first sample and hold circuit to sample said output signal during each of said stimulus pulses and for actuating said second sample and hold circuit to sample said output signal after termination of each of said stimulus pulses to thereby synchronize said processing means with said pulse generator.

2. The apparatus of claim 1 wherein said second sample and hold circuit is actuated at the occurrence of the trailing edge of each pulse.

3. The apparatus of claim 2 wherein said current detector is inductive.

4. The apparatus of claim 1 wherein said second sample and hold circuit is actuated subsequent to the trailing edge of each pulse.

5. The apparatus of claim 4 wherein said current detector utilizes the Hall effect.

6. The apparatus of claim 1 wherein said processing means further includes means for producing a voltage signal related to the difference between the two values of the output signal sampled by said two sample and hold circuits, respectively.

7. The apparatus of claim 6 wherein said sample and hold circuits include means for integrating the samples of said output signal.

8. The apparatus of claim 1 wherein said parameter is the magnitude of the current.

9. The apparatus of claim 8 wherein said parameter includes the relative direction of current flow.

10. A circuit for locating a fault within an electrical circuit, comprising:

a pulse generator for applying pulses to a conductor;

means for electrically connecting said pulse generator to the conductor;

a current responsive device for producing an output signal related to the current flowing in the conductor;

a first sample and hold circuit for sampling said output signal;

a second sample and hold circuit for sampling said output signal;

a timing circuit responsive to said pulses for actuating said first sample and hold circuit to sample said output signal during each of said pulses and for actuating said second sample and hold circuit to sample said output signal at a different time related to the termination of each of said pulses; and means for producing an output voltage related to the difference in the sampled values of the output signal stored in said first and second sample and hold circuits.

11. The circuit of claim 10 wherein each of said first and second sample and hold circuits includes means for integrating the samples of the output signal.

12. The circuit of claim 10 wherein said current responsive device is an inductive current sensor, and said timing circuit actuates said first sample and hold circuit upon the leading edge of each pulse and actuates said second sample and hold circuit upon the trailing edge of each pulse.

13. The circuit of claim 10 wherein said current responsive device is a Hall effect type current sensor, and wherein said timing circuit actuates said first sample and hold circuit during each pulse and actuates said second sample and hold circuit subsequent to the termination of each pulse.

14. A method for locating a faulty node among a plurality of nodes connected to a common bus that remains in one binary state, comprising the steps of:

applying a series of stimulus pulses of the opposite binary state to the common bus;

for each node,
  (i) producing a voltage signal related to the current flowing at the node,
  (ii) sampling the voltage signal at a rate corresponding to the frequency at which said stimulus pulses are applied,
  (iii) integrating the samples of the voltage signal, and
  (iv) producing an output voltage related to at least one parameter of the current in the node from the integrated samples; and identifying the node having the greatest relative output voltage as the faulty node; wherein the step of sampling the voltage signal includes taking two samples of the voltage signal at different times for each stimulus pulse, one time being during said stimulus pulse and the other time being after the termination of said stimulus pulse, and the step of producing the output voltage includes generating a signal related to the difference between the two samples.

15. The method of claim 14 wherein said parameter is the magnitude of the current.

16. The method of claim 15 wherein said parameter includes the relative direction of current flow.

17. A method for locating a fault within an electrical circuit by detecting the value of the current flowing in a conductor, comprising the steps of:

applying a series of electrical stimulus pulses to the conductor;

producing a signal related to the current flowing in the conductor;

taking a first sample of the current related signal during each of the stimulus pulses;

taking a second sample of the current related signal at a time determined by the termination of each of the stimulus pulses; and generating an output signal related to the difference between the two samples.

18. The method of claim 17 further including the step of integrating said samples.

* * * * *